United States Patent
Ladd et al.

(10) Patent No.: US 11,462,581 B2
(45) Date of Patent: Oct. 4, 2022

(54) PHOTODETECTOR ADAPTED TO PROVIDE ADDITIONAL COLOR INFORMATION

(71) Applicant: BAE Systems Imaging Solutions Inc., San Jose, CA (US)

(72) Inventors: John W. Ladd, Santa Clara, CA (US); James E. Crouch, Santa Rosa, CA (US); Alberto M. Magnani, Danville, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 781 days.

(21) Appl. No.: 16/305,551

(22) PCT Filed: May 31, 2017

(86) PCT No.: PCT/US2017/035122
§ 371 (c)(1),
(2) Date: Nov. 29, 2018

(87) PCT Pub. No.: WO2017/210250
PCT Pub. Date: Dec. 7, 2017

(65) Prior Publication Data
US 2021/0225913 A1 Jul. 22, 2021

Related U.S. Application Data

(60) Provisional application No. 62/343,314, filed on May 31, 2016.

(51) Int. Cl.
*H01L 27/146* (2006.01)
*H04N 5/357* (2011.01)

(52) U.S. Cl.
CPC .. *H01L 27/14621* (2013.01); *H01L 27/14609* (2013.01); *H01L 27/14672* (2013.01); *H04N 5/3575* (2013.01)

(58) Field of Classification Search
CPC ......... H01L 27/14621; H01L 27/14672; H01L 27/14609; H04N 5/3575
See application file for complete search history.

(56) References Cited

U.S. PATENT DOCUMENTS 6,566,723 B1  5/2003  Vook et al.
8,344,306 B2  1/2013  Kim
(Continued)

FOREIGN PATENT DOCUMENTS

EP  1119188 A2  7/2001

OTHER PUBLICATIONS

International Search Report, PCT/US17/35122, dated Aug. 11, 2017, 10 pages.
EP Search Report, EP 17807372.2, dated Dec. 19, 2019, 8 pages.

*Primary Examiner* — Robert H Kim
*Assistant Examiner* — Monica T Taba
(74) *Attorney, Agent, or Firm* — Gary McFaline; Scott J. Asmus; Calvin B. Ward (57) ABSTRACT

An apparatus for forming a color image of a scene and a method for utilizing that apparatus are disclosed. The apparatus includes a plurality of pixel sensors. Each pixel sensor includes a first photodetector includes first main photodiode and a first floating diffusion node. The first main photodiode is characterized by a first light conversion efficiency as a function of wavelength of a light signal incident thereon. The first floating diffusion node includes a parasitic photodiode characterized by a second light conversion efficiency as a function of the wavelength. The second light conversion efficiency is different from the first light conversion efficiency as a function of wavelength. A controller generates an intensity of light in each of a plurality of wavelength bands for the pixel sensor utilizing a measurement of the light (Continued)

signal by each of the first main photodiode and the first parasitic photodiode in that photodetector.

15 Claims, 5 Drawing Sheets

(56) References Cited

U.S. PATENT DOCUMENTS

| | | | |
|---|---|---|---|
| 2005/0001143 A1* | 1/2005 | Rhodes | H04N 5/37457 250/208.1 |
| 2007/0035653 A1* | 2/2007 | Hong | H04N 5/335 348/340 |
| 2007/0252073 A1 | 11/2007 | Yang et al. | |
| 2008/0136933 A1 | 6/2008 | Dosluoglu et al. | |
| 2009/0046186 A1* | 2/2009 | Nagai | H01L 27/14641 348/301 |
| 2009/0174801 A1* | 7/2009 | Dungan | H04N 5/367 348/308 |
| 2013/0341750 A1* | 12/2013 | Ichikawa | H01L 27/14647 257/440 |
| 2015/0122974 A1 | 5/2015 | Fowler | |
| 2016/0165159 A1* | 6/2016 | Hseih | H01L 27/14632 348/273 |

* cited by examiner

PHOTODETECTOR ADAPTED TO PROVIDE ADDITIONAL COLOR INFORMATION

BACKGROUND

Imaging arrays for use in color photography typically use four photodiodes per pixel in the final image. The photodiodes are typically arranged in a 2×2 array with a red filter over one photodiode, a blue filter over a second photodiode and a green filter over the remaining two photodiodes. The color filters select a relatively broad range of wavelengths, and hence, the photodiodes measure an average of the light intensity over a broad range of wavelengths in the red, blue, and green wavelength bands. Hence, these photodiodes are relatively insensitive to wavelength variations within the acceptance band of the filters. In addition, the use of four photodiodes for each image pixel increases the cost of the imaging array over a monochrome array by a factor of approximately four. Finally, the filters reduce the light reaching the photodiodes, and hence, either lower the sensitivity of the array in low light conditions or require larger photodiodes to compensate for the loss in intensity.

SUMMARY

The present invention includes an apparatus for forming a color image of a scene and a method for utilizing that apparatus. The apparatus includes a plurality of pixel sensors. Each of the pixel sensors includes a first photodetector that includes a first main photodiode and a first floating diffusion node. The first main photodiode is characterized by a first light conversion efficiency as a function of wavelength of a light signal incident thereon. The first floating diffusion node includes a parasitic photodiode characterized by a second light conversion efficiency as a function of the wavelength. The second light conversion efficiency is different from the first light conversion efficiency as a function of wavelength. The floating diffusion node also is illuminated by the light signal. The apparatus also includes a controller that generates an intensity of light in each of a plurality of wavelength bands for the pixel sensor utilizing a measurement of the light signal by each of the first main photodiode and the first parasitic photodiode in that photodetector.

In one aspect of the invention, the second light conversion efficiency is greater than three percent of the first light conversion efficiency. In another aspect, the second light conversion efficiency is greater than ten percent of the first light conversion efficiency.

In a still further aspect, the apparatus includes a plurality of second photodetectors, each pixel sensor being associated with one of the plurality of second photodetectors, the second photodetectors having a second main photodiode with a third light conversion efficiency as a function of the wavelength, the third light conversion efficiency being different from the first and second light conversion efficiencies. The second photodiodes provide a third measurement of the light signal, the third measurement being used by the controller to generate the intensities of light in the plurality of wavelength bands.

In one aspect, there is one second photodetector for each pixel sensor.

In another aspect, there are fewer second photodetectors then pixel sensors, at least one of the second photodetectors being shared by a plurality of pixel sensors. In a still further aspect, the controller interpolates intensity measurements from a plurality of the second photodetectors to arrive at the third measurement.

In another aspect, the second photodiode is part of a second photodetector in each pixel sensor and the second photodetector further includes a second floating diffusion node that is separate from the first floating diffusion node, the second floating diffusion node includes a second parasitic photodiode, the processor using a signal from the second parasitic photodiode to generate the intensities in each of the plurality of wavelength bands.

The present invention also includes a method for generating a color image of a scene that includes a plurality of color pixels. The method includes projecting the image on an array of pixel sensors, each pixel sensor generating one color pixel of the color image. Each pixel sensor includes a first photodetector having a main photodiode and a floating diffusion node. The first main photodiode is characterized by a first light conversion efficiency as a function of wavelength of a light signal incident on the pixel sensor. The first floating diffusion node includes a parasitic photodiode characterized by a second light conversion efficiency as a function of the wavelength, the second light conversion efficiency being different from the first light conversion efficiency as a function of wavelength.

First and second light intensity values are generated for each pixel sensor from the first main photodiode and the first floating diffusion node in each of the pixel sensors. A third light intensity value corresponding to each pixel sensor is generated utilizing a corresponding one of a plurality of second photodetectors having a third light conversion efficiency as a function of wavelength that is different from first and second light conversion efficiencies. Each color pixel is generated utilizing the first, second, and third light intensity values corresponding to that pixel.

In one aspect of the invention, the second photodetector is part of each pixel sensor.

In another aspect, the plurality of second photodetectors includes one second photodetector that is shared by a plurality of the pixel sensors.

In another aspect, intensity values from two or more of said plurality of second photodetectors are interpolated to arrive at said third light intensity value for one of said pixel sensors.

In a further aspect, each second photodetector includes a floating diffusion node that includes a second parasitic photodiode, and a light intensity value from the second parasitic photodiode is used also used to generate the color pixel.

DETAILED DESCRIPTION

For the purposes of the present discussion, a digital camera converts an image of a scene into an array of pixels representing the scene. In the case of a color image, each pixel can be represented by a color vector having components in three or more color channels. Each color component typically represents the intensity of the light in a corresponding band of wavelengths. Typically, the color components represent the intensities in the red, blue, and green wavelength bands in the optical spectrum.

The imaging array that captures the light typically includes a number of photodetectors that are used to measure the light intensities that are used to generate the color vector. In the following discussion, the group of photodetectors that provides the information for a single pixel in the final image will be referred to as the pixel sensor for that pixel. In conventional color imaging detectors, there are four photodetectors in each pixel sensor. Each photodetector is covered by a filter that selects light in a particular band of wavelengths. In systems that use three color components, one photodetector is covered by a filter that passes red light and blocks other bands, one photodetector is covered by a filter that passes blue light, and two photodetectors are covered by filters that pass green light.

In conventional imaging arrays, each photodetector has a single photodiode that converts the incident light on that photodetector during an exposure period to a charge and circuitry for generating a voltage signal from that charge. The voltage signal is typically digitized to produce an intensity reading for the light incident on that photodetector. In one aspect of the present invention, each photodetector includes two photodiodes, while requiring only the same amount of silicon surface area of a single conventional photodetector having one photodiode. In addition, the two photodiodes of the photodetector have different light sensitivities as a function of wavelength of the incident light, and hence, can be used to provide color information without requiring wavelength filters that reduce the light intensity.

Figure 1:
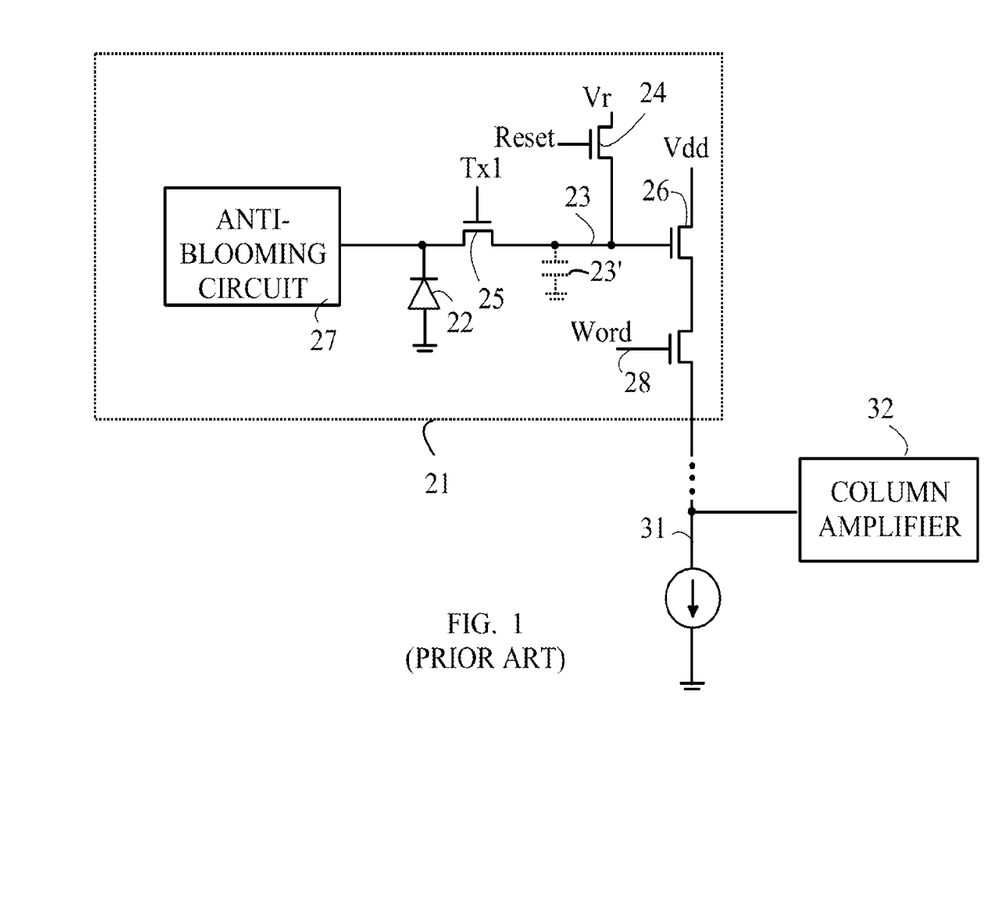
FIG. 1 is a schematic drawing of a typical prior art photodetector in one column of photodetectors in an imaging array.

FIG. 1 is a schematic drawing of a typical prior art photodetector in one column of photodetectors in an imaging array. Photodetector 21 includes a photodiode 22 that measures the light intensity at a corresponding pixel in the image. As noted above, in prior art pixel sensors, there are typically four such photodetectors corresponding to each pixel sensor. Initially, photodiode 22 is reset by placing gate 25 in a conducting state and connecting floating diffusion node 23 to a reset voltage, Vr. Gate 25 is then closed and photodiode 22 is allowed to accumulate photoelectrons during an exposure period. A potential on an optional anti-blooming circuit 27 sets the maximum amount of charge that can be accumulated on photodiode 22. If more charge is accumulated than allowed by anti-blooming circuit 27, the excess charge is removed from photodiode 22.

After photodiode 22 has been exposed, the charge accumulated in photodiode 22 is typically measured by noting the change in voltage on floating diffusion node 23 when the accumulated charge from photodiode 22 is transferred to floating diffusion node 23. For the purposes of the present discussion, a floating diffusion node is defined to be an electrical node that is not tied to a power rail, or driven by another circuit. In the photodetector shown in FIG. 1, one source/drain side of the transfer gate transistor and the drain side of the photodetector reset transistor are tied together. When neither gate of these transistors is active, the connected source/drain diffusions are considered to be one floating diffusion node. Floating diffusion node 23 is characterized by a capacitance represented by capacitor 23'. In practice, capacitor 23' is charged to a voltage, Vr, and isolated by pulsing the reset line of gate 24 prior to floating diffusion node 23 being connected to photodiode 22. The charge accumulated on photodiode 22 is transferred to floating diffusion node 23 when gate 25 is opened. The voltage on floating diffusion node 23 is sufficient to remove all of this charge, leaving the voltage on floating diffusion node 23 reduced by an amount that depends on the amount of charge transferred and the capacitance of capacitor 23'. Hence, by measuring the change in voltage on floating diffusion node 23 after gate 25 is opened, the accumulated charge can be determined.

This scheme assumes that the reset potential on the floating diffusion node prior to transferring the charge from photodiode 22 is known. In practice, the actual reset voltage will vary from the voltage, Vr, due to noise. If this noise is significant, a correlated double sampling algorithm can be utilized to reduce the errors caused by the noise. In the correlated double sampling processing, the actual voltage on the floating diffuse node after the reset operation is performed is measured prior to connecting photodiode 22 to floating diffusion node 23. The difference between this measured reset voltage and the voltage after the charge has been transferred is used to calculate the charge generated during the exposure. The procedure starts by connecting floating diffusion node 23 to Vr using reset gate 24. The potential on floating diffusion node 23 is then measured by connecting source follower 26 to readout line 31 by applying a select signal to word line 28. This reset potential is stored in column amplifier 32. Next, gate 25 is placed in a conducting state and the charge accumulated in photodiode 22 is transferred to floating diffusion node 23. It should be noted that floating diffusion node 23 is effectively a capacitor that has been charged to Vr. Hence, the charge leaving photodiode 22 lowers the voltage on floating diffusion node 23 by an amount that depends on the capacitance of floating diffusion node 23 and the amount of charge that is transferred. The voltage on floating diffusion node 23 is again measured after the transfer. The difference in voltage is then used to compute the amount of charge that accumulated during the exposure.

A "parasitic photodiode" is an inherent property of the floating diffusion node in many photodetector designs. A depletion region is formed by the floating diffusion node and the gates of other transistors in the photodetector. The parasitic photodiode collects photoelectrons from photons that are converted in the silicon under the floating diffusion node. In the prior art, care is taken to minimize the conversion efficiency of the parasitic photodiode. For example, in some designs, a mask is provided over the floating diffusion node to block light from striking the node to reduce the light conversion efficiency of the parasitic photodiode. In contrast, the present invention is based on the observation that a photodetector of the type discussed above can be modified to enhance the light conversion efficiency of the parasitic photodiode to provide a second photodiode that does not significantly increase the size of the photodetector, and hence, the present invention provides the advantages of a two-photodiode photodetector in which the two photodiodes have different color responses without significantly increasing the photodetector.

Figure 2:
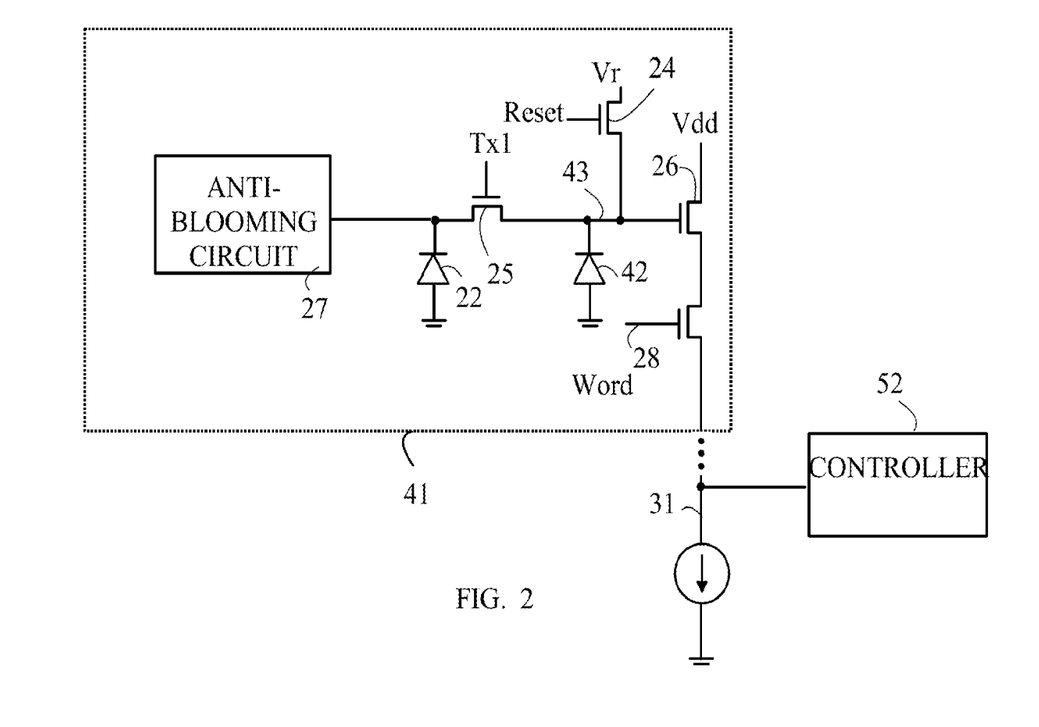
FIG. 2 illustrates a photodetector in which the parasitic photodiode is utilized in an image measurement.

Refer now to FIG. 2, which illustrates a photodetector in which the parasitic photodiode is utilized in an image measurement. To distinguish the parasitic photodiode 42, photodiode 22 will be referred to as the "main photodiode". To simplify the following discussion, those elements of photodetector 21 that serve functions analogous to those discussed above with respect to FIG. 1 have been given the same numeric designations and will not be discussed further unless such discussion is necessary to illustrate a new manner in which those elements are utilized. In general, parasitic photodiode 42 that is part of floating diffusion node 43 has a detection efficiency that is significantly less than that of main photodiode 22. For the purposes of the present discussion, the detection efficiency of a photodiode is a function of the wavelength of the light that irradiates that photodiode and is defined to be the average number of photoelectrons generated per unit of energy of photons of a particular wavelength. In co-pending U.S. patent application Ser. No. 14/591,873, filed on Jan. 7, 2015, this difference in detection efficiency between the main and parasitic photodiodes is utilized to increase the dynamic range of the photodetector by adjusting the conversion efficiencies of the two photodiodes such that the parasitic photodiode provides an intensity measurement at incident light intensities that are too great to be measured in the main photodiode. For example, the parasitic photodiode could have a conversion efficiency that is three percent of the conversion efficiency of the main photodiode. In another example the parasitic photodiode has a conversion efficiency that is greater than ten percent of the conversion efficiency of the main photodiode. Other examples of the detection efficiency and methods for adjusting the relative conversion efficiencies of the main and parasitic photodiodes are discussed in this US Patent Application, which is incorporated by reference herein, and hence, will not be discussed in detail here.

The present system is based on the observation that the parasitic photodiode has a different color response than the main photodiode in the photodetector. That is, the ratio of the conversion efficiency of the parasitic photodiode to the conversion efficiency of the main photodiode is not a constant as a function of the wavelength of the incident light. In fact, as will be discussed in more detail below, this ratio can be used to provide information on the average wavelength of the light incident on the two photodiodes. This information can be used to refine the color measurement without the need to provide a color filter over the photodetectors. This information can also be used to reduce the number of photodetectors per pixel sensor in the imaging array. In one aspect of the present system, controller 52 includes a processor that performs the color computations that generate the intensities in the color channels utilizing the parasitic photodiode as one photodetector in the pixel sensor.

Figure 4:
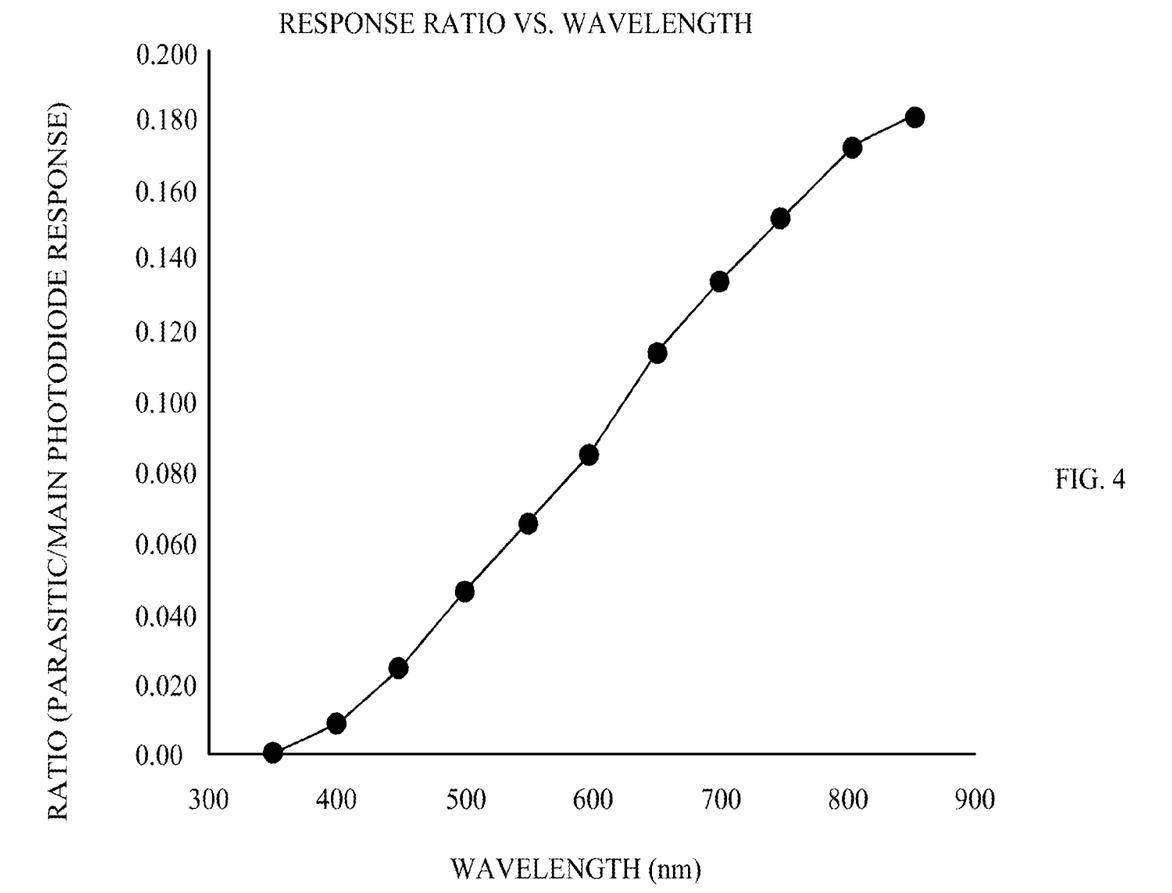
FIG. 4 illustrates the ratio of the two conversion efficiencies in one embodiment.

The number of photoelectrons generated by a photon interacting with the photodiode as a function of the photon wavelength depends on a number of factors. The main photodiode may have a significantly different depth profile than the parasitic photodiode, hence, the wavelength response of the two different photodiodes will be different. In addition, the main photodiode is typically a pinned photodiode and the parasitic photodiode is not. Other factors affecting the relative parasitic response include a difference in the spatial position of the parasitic photodiode relative to the micro-lens that is placed over the pixel detector, and the difference in electrical and optical crosstalk as a result of a number of geometric, layout, implant, and structural differences. In general, it is advantageous to adjust the overall conversion efficiency of the parasitic photodiode to be close to that of the main photodiode; however, in practice the conversion efficiency of the parasitic photodiode is less than that of the main photodiode. The ratio of the two conversion efficiencies in one embodiment of the present invention is shown in FIG. 4.

Denote the signal from the main photodiode by $S_m$ and the signal from the parasitic photodiode by $S_p$. Then, $$S_m = I_r C_{mr} + I_g C_{mg} + I_b C_{mb}$$

$$S_p = I_r C_{pr} + I_g C_{pg} + I_b C_{pb} \quad (1)$$

Here, $C_{mr}$, $C_{mg}$, and $C_{mb}$ are calibration constants for the main photodiode that are related to the conversion efficiency of the main photodiode in the red, green, and blue wave bands, respectively, and $C_{pr}$, $C_{pg}$, and $C_{pb}$ are calibration constants for the parasitic photodiode that are related to the conversion efficiency of the parasitic photodiode in the red, green, and blue wave bands, respectively. Eqs. (1) provide two equations in three unknowns, i.e., the intensity of the incident light in the three wavelength bands. Hence, these equations cannot be solved to provide the desired intensities without some additional information in the general case.

Figure 3A:
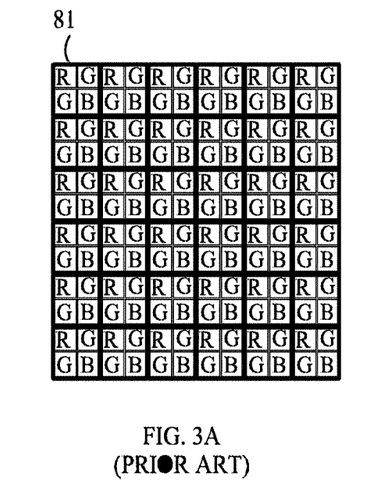
FIG. 3A illustrates a conventional imaging array.

Refer now to FIG. 3A which illustrates a conventional imaging array. Each pixel sensor 81 has four photodetectors. It is assumed that the light intensity does not vary significantly over the pixel, and hence, each photodetector receives the same incident light intensity. Typically, each photodetector has a filter that limits the light reaching the photodetector to light in a particular wavelength band. The filters are denoted by R, B, and G in the figure. Typically, two photodetectors are used to measure the intensity in the green wavelengths in the Bayer RGB color filter pattern scheme shown in the figure. As noted above, the filters remove a significant fraction of the light, and hence, the shot noise associated with each photodetector is increased relative to the shot noise that would be experienced without the filters. In essence, this prior art pixel design provides four intensity measurements from which to obtain the intensity of light in the three wavelength bands.

Figure 3B:
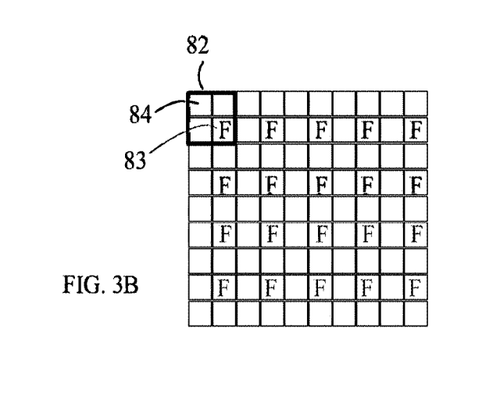
FIG. 3B illustrates which illustrates an imaging array using four photodetector pixel sensors according to one embodiment of the present invention.

Refer now to FIG. 3B, which illustrates an imaging array using four photodetector pixel sensors according to one embodiment of the present invention. Each pixel sensor 82 now includes one photodetector 83 that has a color filter, F, and three photodetectors 84 that are unfiltered. Since each photodetector now provides two intensity measurements having different color weightings, there are effectively eight useful intensity measurements. Suppose a filter is provided over one of the photodetectors to provide a third response. The remaining photodetectors do not include filters. Then, $$S_{i,m} = I_r C_{mr} + I_g C_{mg} + I_b C_{mb}$$

$$S_{i,p} = I_r C_{pr} + I_g C_{pg} + I_b C_{pb}$$

$$S_{fm} = I_r C_{fmr} + I_g C_{fmg} + I_b C_{fmb}$$

$$S_{fp} = I_r C_{fpr} + I_g C_{fpg} + I_b C_{fpb} \quad (2)$$

where i runs from 1 to 3. Here, $C_{fmr}$, $C_{fmg}$, and $C_{fmb}$ are conversion efficiencies for the main photodiode in the filtered pixel, and $C_{fpr}$, $C_{fpg}$, and $C_{fpb}$ are conversion efficiencies for the parasitic photodiode in the filtered pixel. A least squares fit to the eight measurements can now be done to provide an improved estimate of the intensities of the incident light in the three color bands. The filter could select a particular color channel such as a green, red, or blue filter. Alternatively, one or more filters could merely partially attenuate light in one of the filter channels to provide the required independent measurement while sacrificing less light.

Figure 3C:
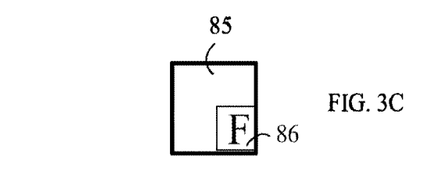
FIG. 3C illustrates a pixel sensor having two photodetectors of different sizes.

In principle, a pixel sensor could be utilized that has only two photodetectors, one with a filter and one without. This would provide four intensity measurements to determine the color intensities. Refer now to FIG. 3C, which illustrates a pixel sensor having two photodetectors of different sizes. Photodetector 85 lacks a filter, and photodetector 86 has a filter. The two photodetectors provide four intensity measurements that can be used to determine the three color intensities. The total area of the pixel for a given signal-to-noise level will be less than that of the conventional pixel sensor for the same signal-to-noise level, as the amount of light received per unit area is greater due to the lack of a filter in photodetector 85.

The above-described embodiments utilize a three-channel color representation system to determine the intensities in channels corresponding to the red, blue, and green wavelength bands. Even a two-photodiode pixel sensor embodiment according to the present invention provides more intensity measurements than needed to determine the three channel intensities. The additional measurements can be used to reduce noise or to provide intensities in other color schemes having more color channels.

Figure 5:
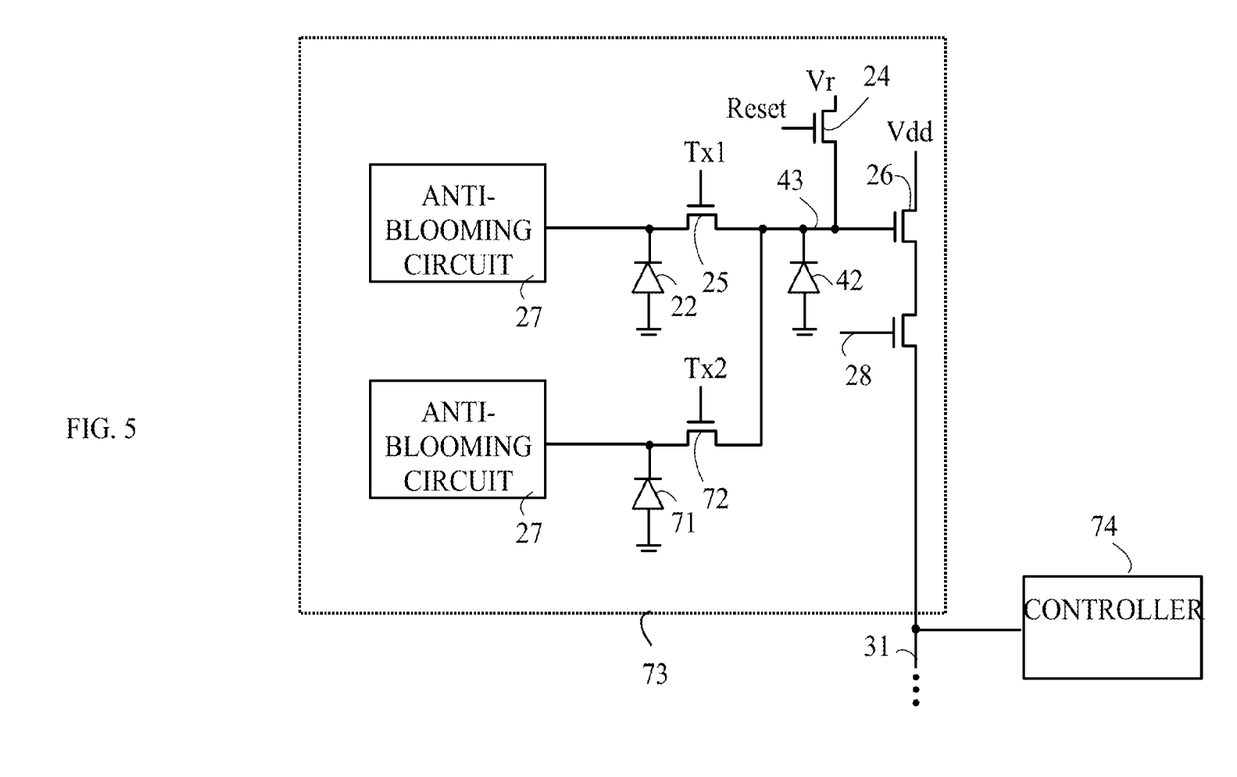
FIG. 5 illustrates a pixel sensor having two main photodiodes that share a common floating diffusion node that has a parasitic photodiode response.

In the above embodiments, a second photodetector that provides the information needed to uniquely solve for the three or more color channel intensities is included in every pixel. However, the response from a third photodetector that has a different light conversion efficiency as a function of wavelength than that provided by the main photodiode and a parasitic photodiode in a single photodetector can be provided in other configurations. Refer now to FIG. 5, which illustrates a pixel sensor having two main photodiodes that share a common floating diffusion node that has a parasitic photodiode response. To simplify the following discussion, those elements of pixel sensor 73 that provide the same functions as corresponding elements in photodetector 41, discussed above with reference to FIG. 2, have been given the same numeric designations. Pixel sensor 73 includes a second main photodiode 71 that can be connected to floating diffusion node 43 by gate 72. The second main photodiode 71 has a different color response than photodiode 22 and parasitic photodiode 42. For example, second main photodiode 71 could be covered by a color filter. For example, second main photodiode 71 could be filtered such that second main photodiode 71 detects light preferentially in the blue or green portions of the spectrum. The cost of adding the second photodiode to pixel sensor 73 is much smaller than providing a complete second photodetector to implement a pixel sensor, since second main photodiode 71 shares all of the readout and reset circuitry. If the intensity of light is provided by main photodiode 22, then second main photodiode 71 need not be as large as photodiode 22, since the purpose of second main photodiode 71 is to provide the remaining color information, and the human eye is less sensitive to errors in color than errors in intensity. Controller 74 combines the color information form the three photodiodes to provide the intensities in the three color channels.

For the purposes of the present discussion, this second main photodetector that provides the third color equation, will be referred to as the secondary photodetector in the following discussion. If the incident light on a pixel were of a single pure color, i.e., a spectrum consisting of light at one wavelength or narrow band of wavelengths, the secondary photodetector would not be needed to determine the wavelength. It can be shown that the ratio of the signals from the parasitic photodiode to the main photodiode is a function of the average wavelength of the incident light on the photodetector. The function in question depends on the details of the main and parasitic photodiodes and can be calibrated for any particular design, provided the ratio of light response of the main photodiode to the secondary photodiode is a monotonic function of wavelength in the region of the spectrum of interest. In one embodiment, the ratio of light response is a linear function of the average wavelength.

The ratio of the parasitic photodiode response to the main photodiode response is shown in FIG. 4 for one exemplary photodetector. In this embodiment, this ratio is a linear function of the average wavelength of the light incident on the photodetector over a significant fraction of the optical spectrum. The functional relationship between the ratio of the responses and the wavelength of the incident light depends on the details of the construction of the photodiode. If there is only one wavelength in the incident light, this ratio can be used to determine that wavelength and one of the equations in Eqs. (1) can be used to determine the intensity in the one RGB triplet color that is non-zero. It should be noted that if the average wavelength corresponds to red or blue, and camera filters remove wavelengths above and below the visual range, then there is only one wavelength in the incident light, and hence, the two equations can provide a unique solution for the wavelength. If, however, the average wavelength is within the intermediate wavelength band, the incident light could be the combination of two spectral lines, one in the red and one in the blue. In this case, information from a second photodiode or photodetector is needed.

Figure 3D:
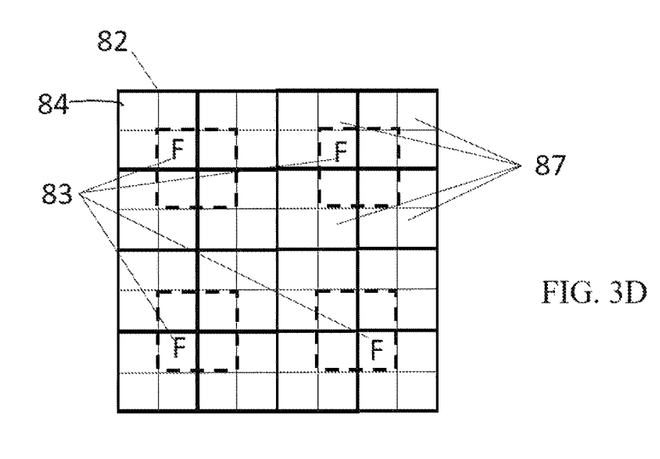
FIG. 3D illustrates a pixel having fewer photodetectors than pixel sensors.

As shown in FIG. 3D, if the information in one of the color channels changes slowly over the image, the density of secondary photodetectors 83 can be reduced in the array. In this case, one secondary photodetector 83 can be provided for every N pixel sensors 87 (wherein the dashed lines are added for clarity), where N>1. The results from these sparse secondary photodetectors can be interpolated to provide a value at each pixel detector.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising a plurality of pixel sensors, each pixel sensor comprising:
   a plurality of first photodetectors comprising a first main photodiode characterized by a first light conversion efficiency as a function of wavelength of a light signal incident thereon;
   a first floating diffusion node comprising a first parasitic photodiode characterized by a second light conversion efficiency as a function of said wavelength, said second light conversion efficiency, being different from said first light conversion efficiency as a function of wavelength, said first floating diffusion node also being illuminated by said light signal;
   a plurality of second photodetectors having a second main photodiode characterized by a third light conversion efficiency as a function of said wavelength, said third light conversion efficiency being different from said first and second light conversion efficiencies and also being illuminated by said light signal and wherein there are fewer second photodetectors than first photodetectors; and said apparatus further comprising a controller that generates an intensity of light in each of a plurality of wavelength bands for said pixel sensor utilizing a measurement of said light signal by each of said first main photodiode, said first parasitic photodiode and said second main photodiode, said measurements being used by said controller to generate said intensities of light in said plurality of wavelength bands and providing a color image.

2. The apparatus of claim 1 wherein said second light conversion efficiency is greater than three percent of said first light conversion efficiency.

3. The apparatus of claim 1 wherein said second light conversion efficiency is greater than ten percent of said first light conversion efficiency.

4. The apparatus of claim 1 wherein there is one second photodetector for each pixel sensor.

5. The apparatus of claim 1 wherein said controller interpolates intensity measurements from a plurality of said second photodetectors to arrive at said third measurement.

6. The apparatus of claim 1 wherein the second main photodiode is smaller than the first main photodiode.

7. The apparatus of claim 1 further comprising a filter on one of the first photodetector or the second photodetector.

8. The apparatus of claim 1 further comprising a readout and a reset circuit shared by the first and second photodiode.

9. The apparatus of claim 1 comprising four photodetector pixel sensors forming a color imaging array.

10. A method for generating a color image of a scene comprising a plurality of color pixels, said method comprising:
projecting an image of said scene on an array of pixel sensors, each pixel sensor generating one color pixel of said color image, each pixel sensor comprising a first photodetector comprising:
a first main photodiode characterized by a first light conversion efficiency as a function of wavelength of a light signal incident on said pixel sensor; and
a first floating diffusion node comprising a first parasitic photodiode characterized by a second light conversion efficiency as a function of said wavelength, said second light conversion efficiency, being different from said first light conversion efficiency as a function of wavelength, said first floating diffusion node also being illuminated by said light signal;
generating first and second light intensity values for each pixel sensor from said first main photodiode and said first floating diffusion node in each of said pixel sensors;
generating a third light intensity value corresponding to each pixel sensor utilizing a corresponding one of a plurality of second photodetectors having a third light conversion efficiency as a function of wavelength that is different from first and second light conversion efficiencies; and
generating each color pixel utilizing said first, second, and third light intensity values corresponding to that pixel, wherein said plurality of second photodetector comprises one second photodetector that is shared by a plurality of said pixel sensors.

11. The method of claim 10 wherein said second photodetector is part of each pixel sensor.

12. The method of claim 10 wherein intensity values from two or more of said plurality of second photodetectors are interpolated to arrive at said third light intensity value for one of said pixel sensors.

13. The method of claim 10 wherein each second photodetector comprises a second floating diffusion node comprising a second parasitic photodiode and wherein a light intensity value from said second parasitic photodiode is used also used to generate said color pixel.

14. A color imaging system, comprising:
a plurality of pixel sensors, each pixel sensor comprising a plurality of first photodetectors and a plurality of second photodetectors and wherein there are fewer second photodetectors than first photodetectors;
a filter on one of the plurality of first photodetectors and the plurality of second photodetectors;
the plurality of first photodetectors, comprising a first main photodiode characterized by a first light conversion efficiency as a function of wavelength of a light signal incident thereon producing a first measurement;
a first floating diffusion node comprising a first parasitic photodiode characterized by a second light conversion efficiency as a function of said wavelength, said second light conversion efficiency, being different from said first light conversion efficiency as a function of wavelength, said first floating diffusion node also being illuminated by said light signal and producing a second measurement;
the plurality of second photodetectors, comprising a second main photodiode with a third light conversion efficiency as a function of said wavelength, said third light conversion efficiency being different from said first and second light conversion efficiencies, said second photodiode providing a third measurement; and
a controller that generates an intensity of light in each of a plurality of wavelength bands for said pixel sensor utilizing the first, second and third measurements to produce a color image.

15. The system of claim 14 wherein the plurality of first and second photodetectors share the first floating diffusion node.

* * * * *